United States Patent
Chen

(10) Patent No.: US 12,484,451 B2
(45) Date of Patent: Nov. 25, 2025

(54) PIEZOELECTRIC COMPONENT, PIEZOELECTRIC APPARATUS AND METHOD FOR MANUFACTURING THE SAME

(71) Applicant: BOE Technology Group Co., Ltd., Beijing (CN)

(72) Inventor: Yuju Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 1095 days.

(21) Appl. No.: 17/486,717

(22) Filed: Sep. 27, 2021

(65) Prior Publication Data

US 2022/0102616 A1 Mar. 31, 2022

(30) Foreign Application Priority Data

Sep. 28, 2020 (CN) .................. 202011040325.4

(51) Int. Cl.
| | |
|---|---|
| H01L 41/047 | (2006.01) |
| H01L 41/053 | (2006.01) |
| H10N 30/00 | (2023.01) |
| H10N 30/03 | (2023.01) |
| H10N 30/06 | (2023.01) |
| H10N 30/072 | (2023.01) |
| H10N 30/08 | (2023.01) |
| H10N 30/853 | (2023.01) |
| H10N 30/87 | (2023.01) |
| H10N 30/88 | (2023.01) |

(52) U.S. Cl.
CPC .......... *H10N 30/877* (2023.02); *H10N 30/03* (2023.02); *H10N 30/06* (2023.02); *H10N 30/072* (2023.02); *H10N 30/08* (2023.02); *H10N 30/706* (2024.05); *H10N 30/8554* (2023.02); *H10N 30/88* (2023.02)

(58) Field of Classification Search
CPC .. H10N 30/877; H10N 30/88; H10N 30/8554; H10N 30/706
USPC ................ 310/365, 366, 334, 335
See application file for complete search history.

(56) References Cited

U.S. PATENT DOCUMENTS

| | | | |
|---|---|---|---|
| 2003/0013969 A1* | 1/2003 | Erikson ................. | B06B 1/0629 600/459 |
| 2005/0140248 A1* | 6/2005 | Kuniyasu ............. | B06B 1/0629 310/334 |
| 2008/0178677 A1* | 7/2008 | Baumgartner ........ | B06B 1/0629 73/606 |

(Continued)

*Primary Examiner* — Derek J Rosenau
(74) *Attorney, Agent, or Firm* — IPro, PLLC

(57) ABSTRACT

This application provides a piezoelectric component, a piezoelectric apparatus and a method for manufacturing the same, and relates to the field of piezoelectric technologies. In order to solve a problem of a relatively large misalignment between a piezoelectric component and a target transfer position on a glass substrate occurred after the piezoelectric component is transferred in the related transfer methods, and to improve the transfer accuracy of the piezoelectric component. The piezoelectric component includes: a component body and at least one electrode structure arranged on a side of the component body. The at least one electrode structure includes a plurality of strip-shaped electrode pins, and the plurality of electrode pins is arranged at intervals.

17 Claims, 1 Drawing Sheet

(56) References Cited

U.S. PATENT DOCUMENTS

2010/0317972 A1\* 12/2010 Baumgartner ....... G10K 11/002
   600/459

\* cited by examiner

PIEZOELECTRIC COMPONENT, PIEZOELECTRIC APPARATUS AND METHOD FOR MANUFACTURING THE SAME

CROSS-REFERENCE TO RELATED APPLICATION

This application claims a priority to Chinese Patent Application No. 202011040325.4 filed on Sep. 28, 2020, the present disclosure of which is incorporated in its entirety by reference herein.

TECHNICAL FIELD

The present disclosure relates to the field of piezoelectric technologies, in particular to a piezoelectric component, a piezoelectric apparatus and a method for manufacturing the same.

BACKGROUND

Haptics is the focus of today's scientific and technological development, and its concept is to make a device terminal interact with a human body based on tactile sense. Haptics includes a vibration feedback technique and a surface tactile rendering technique. The surface tactile rendering technique is to perceive characteristics of an object by touching a screen with a bare finger, and efficient and natural interaction is realized in multimedia terminals, which has great research value, and thus has been widely concerned by researchers in the industry. A surface tactile rendering apparatus is classified into a vibration type, a pressure type, a diaphragm type, an electrostatic force type, and an electrical stimulation type. The formation of tactile sense can be divided into two categories: vibration sense and roughness (tactile impression). The vibration sense is mainly from the action of a positive force applied onto a device, so that skin receptors feel the action of the positive force; and the roughness is from the interaction between the skin (for example, the fingertip skin) and the surface of a device, resulting in different frictions due to different surface structures.

SUMMARY

In a first aspect, the present disclosure provides a piezoelectric component, including: a component body and at least one electrode structure arranged on a side of the component body, where the at least one electrode structure includes a plurality of strip-shaped electrode pins, and the plurality of electrode pins is arranged at intervals.

Optionally, the component body includes a lead zirconate titanate piezoelectric film.

Optionally, a height of each of the plurality of the electrode pins in a direction perpendicular to the component body is greater than 1 μm.

Optionally, the plurality of electrode pins is distributed in an array, an extension direction of each of the electrode pins is perpendicular to the component body, and a minimum width of each of the electrode pins in a first direction is equal to a minimum distance between the electrode pin and an adjacent electrode pin in the first direction, where the first direction is perpendicular to the extending direction.

Optionally, the plurality of electrode pins has same dimensions and is arranged at equal intervals, an extending direction of each of the electrode pins is perpendicular to the component body, and a width of each of the electrode pins in a first direction is equal to a distance of any two adjacent ones of the electrode pins in the first direction, where the first direction is perpendicular to the extension direction.

Optionally, each of the electrode pins is a cylinder, and a diameter of each of the electrode pins is between 3 μm and 4 μm, where endpoint values are inclusive.

Optionally, each of the electrode pins includes a first metal pattern and a second metal pattern that are stacked, and the first metal pattern and the second metal pattern are made of different metal materials.

Optionally, the first metal pattern is located between the component body and the second metal pattern, the first metal pattern is made of titanium (Ti), and the second metal pattern is made of gold (Au) or copper (Cu).

Based on the technical solution of the above piezoelectric component, in a second aspect, the present disclosure provides a piezoelectric apparatus, including a plurality of piezoelectric components described above. The piezoelectric apparatus further includes a first substrate, and a plurality of bonding pads arranged on the first substrate, where the electrode structures in the plurality of piezoelectric components are correspondingly embedded in the plurality of bonding pads.

Optionally, each of the bonding pads includes a transition pattern and a conductive pattern that are stacked, and the transition pattern is located between the conductive pattern and the first substrate, where in a direction perpendicular to the first substrate, heights of the electrode pins included in the electrode structures are smaller than a thickness of the conductive pattern.

Optionally, the transition pattern is made of nickel (Ni), the conductive pattern is made of tin (Sn), and each of the electrode structures of the plurality of piezoelectric components is embedded in the conductive pattern of a corresponding one of the bonding pads.

Optionally, the first substrate includes a rigid substrate or a flexible substrate.

Optionally, piezoelectric apparatus further includes a display panel, where the display panel is reused as the first substrate.

Based on the technical solution of the above piezoelectric apparatus, in a third aspect, the present disclosure provides a method for manufacturing the piezoelectric apparatus as described above, which includes:

forming the plurality of bonding pads on the first substrate;

forming the plurality of piezoelectric components on a second substrate;

pressing each of the electrode structures in the plurality of piezoelectric components into a corresponding one of the bonding pads; and peeling the second substrate from the plurality of piezoelectric components.

Optionally, the forming the plurality of bonding pads on the first substrate specifically includes: sequentially forming a transition film layer and a conductive film layer that are stacked on the first substrate; and patterning the transition film layer and the conductive film layer simultaneously through one patterning process to form a transition pattern and a conductive pattern that are stacked.

Optionally, the forming the plurality of piezoelectric components on the second substrate specifically includes:

forming a piezoelectric film on the second substrate;

patterning the piezoelectric film to form a plurality of component bodies;

forming a metal thin film on a side of the plurality of device bodies facing away from the second substrate; and patterning the metal thin film to form the at least one electrode structure on each of the component bodies.

Optionally, the pressing each of the electrode structures in the plurality of piezoelectric components into a corresponding one of the bonding pads specifically includes:

heating the bonding pads to a preset temperature; and pressing, in an environment with an inert atmosphere, each of the electrode structures in the plurality of piezoelectric components into a corresponding one of the bonding pads.

Optionally, the preset temperature is 40% to 99% of a melting point temperature of the bonding pads.

Optionally, the method further includes: performing an annealing process on the electrode structures and the bonding pads, after peeling the second substrate from the piezoelectric components.

Optionally, the method further includes: after peeling the second substrate from the piezoelectric components, depositing a metal layer on a side of the piezoelectric components facing away from the bonding pads; and patterning the metal layer to form a signal transmission line connected with the piezoelectric components.

BRIEF DESCRIPTION OF THE DRAWINGS

The drawings described herein are used to facilitate a further understanding of the present disclosure and constitute a part of the present disclosure. The exemplary embodiments of the present disclosure and descriptions thereof are used to explain the present disclosure, and do not constitute an improper limitation to the present disclosure. In the appended drawings.

DETAILED DESCRIPTION

Figure 1:
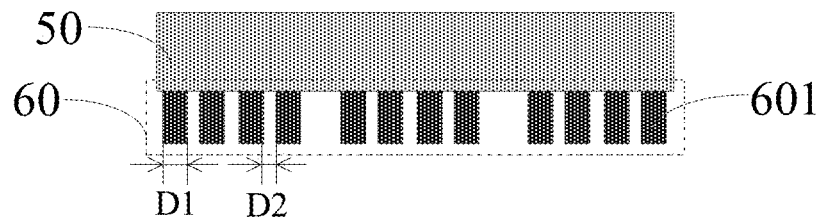
FIG. 1 is a schematic structural diagram of a piezoelectric component provided by an embodiment of the present disclosure.

In order to further illustrate the piezoelectric component, the piezoelectric apparatus and the method for manufacturing the same provided by the embodiments of the present disclosure, detailed descriptions thereof are given below with reference to the accompanying drawings of the specification.

At present, a tactile feedback (haptics) function is mainly realized through piezoelectric components. Due to a high temperature of a film forming process of a piezoelectric component, the piezoelectric component cannot be directly grown on a glass substrate. Generally, the piezoelectric component grows on a sapphire substrate, and is transferred to a glass substrate. The following two transferring methods are generally used.

In a first method, silver glue is used to transfer a piezoelectric component onto a glass substrate. Although this method can realize the transfer of piezoelectric component, it may cause mechanical energy absorption and form damping.

In a second method, a piezoelectric component is placed on a bonding pad of a glass substrate, and then in a high-temperature environment, the piezoelectric component and the bonding pad on the glass substrate are melt-welded to form a eutectic phase. This method needs to be completed in a high-temperature environment, and thermal expansion coefficients of the piezoelectric component and a substrate supporting the piezoelectric component do not match thermal expansion coefficients of the glass substrate and the bonding pad on the glass substrate, thus, they have large differences in their expansion degrees. Consequently, after the piezoelectric component and the bonding pad on the glass substrate (that is, the target transfer position) are melt-welded, a large misalignment between the two elements may occur, which adversely affects the transfer accuracy of the piezoelectric component.

In a detailed implementation, a coefficient of thermal expansion (CTE) of the glass substrate ranges 2.5 ppm/K to 3.2 ppm/K. When the bonding size between the piezoelectric component and the glass substrate is 1 mm×1 mm, the bonding error (such as a degree of misalignment) caused by unmatched thermal expansion coefficients may be greater than 5 μm.

Exemplarily, a piezoelectric component is formed on a sapphire substrate, the CTE of the sapphire substrate is 5.8 ppm/K, and the CTE of the glass substrate is 2.9 ppm/K. When the bonding size between the piezoelectric component and the glass substrate is 10 mm×10 mm, and the bonding temperature is from 300° C. to a room temperature, the bonding error (CTE_mis) caused by the unmatched CTEs is: CTE_mis=2.9×(300−25)×10000=7.9 μm.

In order to solve a problem of a relatively large displacement between the piezoelectric component and a target transfer position on the glass substrate occurred after the piezoelectric component is transferred in the related transfer methods, and to improve the transfer accuracy of the piezoelectric component, embodiments of the present disclosure provide a piezoelectric component, a piezoelectric apparatus and a method for manufacturing the same.

Referring to FIG. 1, an embodiment of the present disclosure provides a piezoelectric component, which includes: a component body 50 and at least one electrode structure 60 arranged on a side of the component body 50. The at least one electrode structure 60 includes a plurality of strip-shaped electrode pins 601, and the strip-shaped electrode pins 601 are arranged at intervals.

Exemplarily, one electrode structure 60 is provided on a first side of the component body 50, an electrode pattern is provided on a second side of the component body 50, and the first side and the second side are opposite.

Exemplarily, two mutually independent electrode structures 60 are provided on the first side of the component body 50.

Exemplarily, each of the electrode pins 601 is a cylinder, and a diameter of the electrode pin is between 3 μm and 4 μm, where end points are inclusive.

Exemplarily, each of the electrode pins 601 is made of a metal material.

Figure 2:
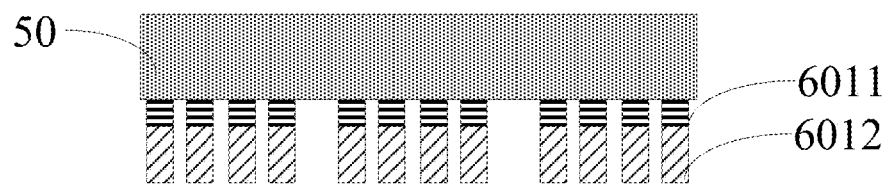
FIG. 2 is a schematic structural diagram of a piezoelectric component provided by an embodiment of the present disclosure.

In some optional embodiments, as shown in FIG. 2, each of the electrode pins 601 includes a first metal pattern 6011 and a second metal pattern 6012 that are stacked, and the first metal pattern 6011 is located between the component body 50 and the second metal pattern 6012. The first metal pattern 6011 has a good adhesive performance, and both the first metal pattern 6011 and the second metal pattern 6012 have a good conductivity performance. In an embodiment, the first metal pattern 6011 is made of metal titanium (Ti) and the second metal pattern 6012 is made of metal gold (Au). In another embodiment, the first metal pattern 6011 is made of metal titanium (Ti), and the second metal pattern 6012 is made of metal copper (Cu).

In an embodiment, a thickness of the first metal pattern 6011 in a direction perpendicular to the component body 50 is much smaller than a thickness of the second metal pattern 6012 in the direction perpendicular to the component body 50. Exemplarily, the thickness of the first metal pattern 6011 in the direction perpendicular to the component body 50 is 10 nm, and the thickness of the second metal pattern 6012 in the direction perpendicular to the component body 50 is 1000 nm.

Exemplarily, in an embodiment of the present disclosure, the piezoelectric component is formed on a sapphire substrate, and then the piezoelectric component is bonded onto a bonding pad of a glass substrate. In a case that a bonding size between the piezoelectric component and the glass substrate is 10 mm×10 mm, the temperature of the sapphire substrate is set to 100° C., and the temperature of the glass substrate is set to 210° C., the bonding error generated after bonding is 1 µm. It can be seen that, compared with the bonding error of the related technology, the bonding error of the piezoelectric component provided by the embodiments of the present disclosure after the piezoelectric component is bonded to the glass substrate is greatly reduced.

When the piezoelectric component provided by the embodiments of the present disclosure is bonded to the bonding pad of the glass substrate, the strip-shaped electrode pins 601 included in the electrode structure 60 of the piezoelectric component can be directly inserted into the corresponding bonding pads in a normal temperature environment or a low temperature environment (such as an environment with a temperature below 170° C.), which not only enables the piezoelectric component and the glass substrate to be accurately aligned, but also effectively increases the contact area between the piezoelectric component and the glass substrate, thereby enhancing the bonding strength between the piezoelectric component and the glass substrate. Moreover, since the piezoelectric component and the bonding pad on the glass substrate achieve an electrical connection with the high Young's modulus and high strength, even after the subsequent high-temperature annealing process, a degree of misalignment between the piezoelectric component and the bonding pad will not be too large, so as to ensure the bonding accuracy of bonding the piezoelectric component onto the glass substrate.

In addition, when the piezoelectric component provided by the embodiments of the present disclosure is bonded to the bonding pad of the glass substrate, the temperature of the piezoelectric component and/or the temperature of the glass substrate may be appropriately increased (for example, the temperature may be set close to a melting point temperature of the bonding pad), which facilitates the insertion of the electrode pins 601 included in the electrode structure 60 of the piezoelectric component into the corresponding bonding pads, to form a finite solid solution. Furthermore, because the strip-shaped electrode pins 601 are inserted into the corresponding bonding pads, even if in a high-temperature environment, the thermal expansion coefficients of the piezoelectric component and the glass substrate are different, too much misalignment will not produce between the piezoelectric component and the bonding pad, which can also ensure the bonding accuracy of bonding the piezoelectric component onto the glass substrate.

In some embodiments, the component body 50 includes a lead zirconate titanate piezoelectric (PZT, $Pb[Zr_{(x)}Ti_{(1-x)}]O_3$) film. In the display substrate provided by the embodiments, the component body 50 includes the lead zirconate titanate piezoelectric film, so that the formed piezoelectric component has good piezoelectric performance and heat release performance.

In some embodiments, in a direction perpendicular to the component body 50, a height of each electrode pin 601 is greater than 1 µm.

Setting the heights of the electrode pins 601 to be greater than 1 µm not only enables the electrode pins 601 to be inserted deeper into the bonding pads, but also effectively increases the contact area between the electrode pins 601 and the bonding pads, which better improves the firmness of the piezoelectric component bonded to the glass substrate.

As shown in FIG. 1, in some embodiments, the plurality of strip-shaped electrode pins 601 are arranged in an array, an extension direction of each electrode pin 601 is perpendicular to the component body 50, and a minimum value of a width D1 of each electrode pin 601 in a first direction is equal to a minimum value of a distance D2 between two adjacent electrode pins 601 in the first direction, where the first direction and the extension direction are vertical to each other.

The above arrangement makes the electrode pins 601 have a suitable distribution density, which not only facilitates the insertion of the electrode pins 601 into the bonding pads, but also improves the contact area between the electrode pins and the bonding pads, and the bonding firmness.

In some optional embodiments, the plurality of electrode pins 601 have the same dimensions and are arranged at equal intervals, an extension direction of each of the electrode pins is perpendicular to the component body, and a width of each of the electrode pins in a first direction is equal to a distance of any two adjacent ones of the electrode pins in the first direction, where the first direction is perpendicular to the extension direction.

As shown in FIG. 1, the plurality of electrode pins 601 extends along a vertical direction. Optionally, a width of the electrode pin 601 in a horizontal direction is equal to a distance of any two adjacent electrode pins in the horizontal direction.

Figure 5:
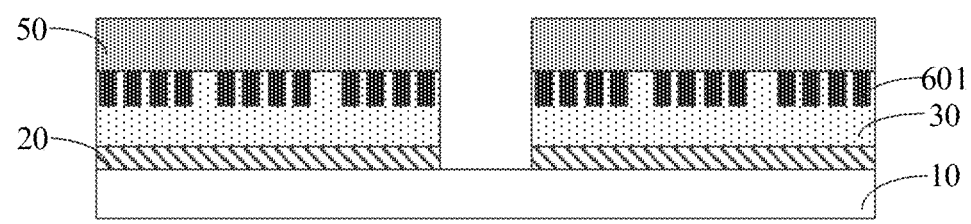
FIG. 5 is a schematic diagram of a piezoelectric apparatus provided by an embodiment of the present disclosure.

As shown in FIG. 5, an embodiment of the present disclosure further provides a piezoelectric apparatus, including the piezoelectric component described above. The piezoelectric apparatus further includes: a first substrate 10, and a plurality of bonding pads arranged on the first substrate 10. The electrode structures 60 in the plurality of piezoelectric components are embedded into the corresponding ones of the bonding pads.

Exemplarily, the first substrate 10 includes a glass substrate.

For example, the plurality of bonding pads are distributed in an array. For another example, the plurality of bonding pads are spaced apart at equal intervals.

In an actual application of the piezoelectric apparatus, the piezoelectric component is deformed by an external force, which may deform a surface of the first substrate 10, generate air compression and slap, and reduce a positive force of a finger of a user when touching the piezoelectric apparatus. When the positive force becomes smaller, the frictional force will be reduced, so that the tactile impression of the finger onto the piezoelectric component will become slippery. The change of the frictional force is controlled according to the time and a touch position of the finger, and the tactile impression of a specific material can be realized.

In the piezoelectric apparatus provided by the embodiments of the present disclosure, the strip-shaped electrode pins 601 included in the electrode structure 60 of the piezoelectric component may be directly inserted into the corresponding bonding pads in a normal temperature environment or a low temperature environment (such as an environment with a temperature below 170° C.), which not only enables the piezoelectric component and the first substrate 10 to be accurately aligned, but also effectively increases the contact area between the piezoelectric component and the first substrate 10, thereby enhancing the bonding strength between the piezoelectric component and the first substrate 10. Moreover, since the piezoelectric component and the bonding pad on the first substrate 10 achieve an electrical connection with the high Young's modulus and high strength, even after the subsequent high-temperature annealing process, a degree of misalignment between the piezoelectric component and the bonding pad will not be too large, so as to ensure the bonding accuracy of bonding the piezoelectric component onto the first substrate 10.

In addition, in the piezoelectric component provided by the embodiments of the present disclosure, when the piezoelectric component is bonded to the bonding pad of the first substrate 10, the temperature of the piezoelectric component and/or the temperature of the first substrate 10 may be appropriately increased, which facilitates the insertion of the electrode pins 601 included in the electrode structure 60 of the piezoelectric component into the corresponding bonding pads. Furthermore, because the strip-shaped electrode pins 601 are inserted into the corresponding bonding pads, even if in a high-temperature environment, the thermal expansion coefficients of the piezoelectric component and the first substrate 10 are different, too much misalignment will not be generated between the piezoelectric component and the bonding pad, which can also ensure the bonding accuracy of bonding the piezoelectric component onto the first substrate 10.

It should be noted that the piezoelectric apparatus may be any product or component with display and touch functions, such as a TV, a display, a digital photo frame, a mobile phone, a tablet computer, and the like.

Figure 3:
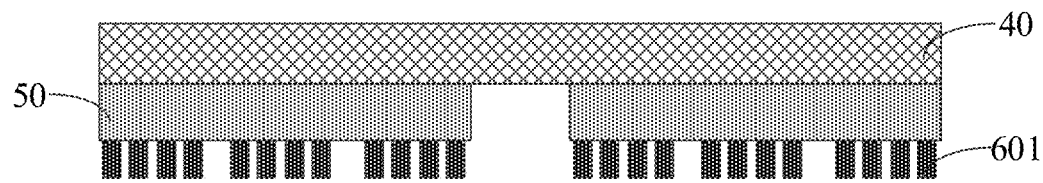
FIG. 3 is a schematic diagram of an piezoelectric component and a second substrate facing each other according to an embodiment of the present disclosure.
Figure 4:
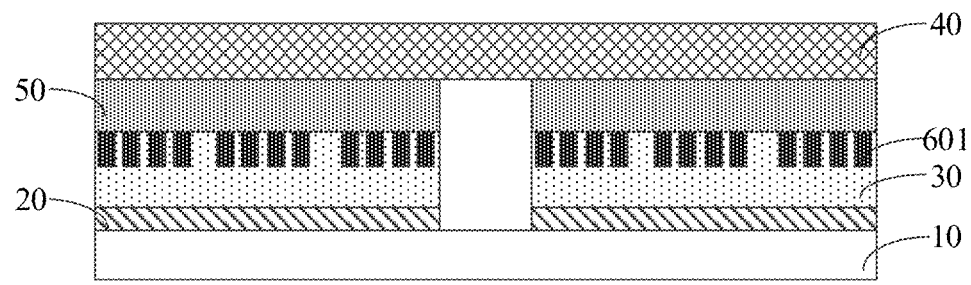
FIG. 4 is a schematic diagram of a piezoelectric component pressed into a bonding pad provided by an embodiment of the present disclosure.

In some embodiments, as shown in FIG. 3 and FIG. 4, the bonding pad includes a transition pattern 20 and a conductive pattern 30 that are laminated, and the transition pattern 20 is located between the conductive pattern 30 and the first substrate 10. In a direction perpendicular to the first substrate 10, a height of each of the electrode pins 601 included in the electrode structures 60 is smaller than a thickness of the conductive pattern 30.

Exemplarily, the transition pattern 20 is made of metal nickel (Ni), and the conductive pattern 30 is made of metal tin (Sn). In an embodiment, a thickness of the transition pattern 20 in the direction perpendicular to the first substrate 10 is much smaller than the thickness of the conductive pattern 30 in the direction perpendicular to the first substrate 10.

Exemplarily, the transition pattern 20 includes a first transition sub-pattern and a second transition sub-pattern that are stacked, the first transition sub-pattern is made of metal nickel material, and the second transition sub-pattern is made of metallic titanium material. Exemplarily, in a direction perpendicular to the first substrate 10, a thickness of the first transition sub-pattern is 10 nm, and a thickness of the second transition sub-pattern is 100 nm.

Exemplarily, in the direction perpendicular to the first substrate 10, the thickness of the transition pattern 20 is 100 nm, and the thickness of the conductive pattern 30 is between 1 μm and 2 μm, which may include endpoint values.

In the piezoelectric apparatus provided by the foregoing embodiments, the bonding pads include the transition pattern 20 and the conductive pattern 30 that are stacked, and the transition pattern 20 can function as a diffusion suppression layer and an adhesion layer, so that the bonding pads have better reliability.

In some embodiments, the first substrate 10 includes a rigid substrate or a flexible substrate.

In some embodiments, the piezoelectric apparatus includes a display panel, and the display panel is reused as the first substrate 10.

Exemplarily, the display panel includes a liquid crystal display panel, the liquid crystal display panel includes an array substrate and a color filter substrate that are arranged oppositely, and a liquid crystal layer arranged between the array substrate and the color filter substrate. The liquid crystal display panel is reused as the first substrate 10, and the bonding pads are formed on a side of the color filter substrate facing away from the liquid crystal layer.

Exemplarily, the display panel includes an organic light emitting diode display panel, the organic light emitting diode display panel is reused as the first substrate 10, and the piezoelectric apparatus is formed on a cover plate of the organic light emitting diode display panel.

It is appreciated that when the display panel is reused as the first substrate 10, the bonding pads and the piezoelectric components may be located in a display area of the display panel, and/or a non-display area of the display panel. The piezoelectric components form a thin film vibrator on the display panel.

As shown in FIG. 3 to FIG. 5, an embodiment of the present disclosure provides a method for manufacturing a piezoelectric apparatus, which is used to manufacture the piezoelectric apparatus provided in the foregoing embodiments. The method includes:

forming the plurality of bonding pads on the first substrate 10;

forming the plurality of piezoelectric components on a second substrate 40;

pressing each of the electrode structures 60 in the plurality of piezoelectric components into a corresponding one of the bonding pads; and peeling the second substrate 40 from the plurality of piezoelectric components.

Exemplarily, a circuit structure may be provided on the first substrate 10, and the bonding pads may be formed on a side of the circuit structure facing away from the first substrate 10, and may be electrically connected to the circuit structure.

Exemplarily, the number of the bonding pads is the same as the number of the electrode structures 60 in the piezoelectric apparatus, and the bonding pads respectively correspond to the electrode structures 60 in the piezoelectric apparatus.

Exemplarily, the first substrate 10 and the second substrate 40 are aligned, and the plurality of bonding pads and the plurality of piezoelectric components are located between the first substrate 10 and the second substrate 40. An orthographic projection of each of the electrode structures 60 onto the first substrate 10 in the piezoelectric components is located within an orthographic projection of a corresponding one of the bonding pads onto the first substrate 10. When pressure is applied to the second substrate 40, the electrode structures 60 in the plurality of piezoelectric components are pressed or inserted into the plurality of bonding pads in a one-to-one correspondence.

The entire second substrate 40 is peeled off from the piezoelectric components by using a laser lift-off (LLO) technology. Exemplarily, a laser lift-off device with a 248 nm or 266 nm light source is used to peel the second substrate 40 from the piezoelectric components.

It is appreciated that in practical applications, the number of piezoelectric components on the second substrate 40 may be more than the number of bonding pads on the first substrate 10. The piezoelectric components with the same number and corresponding positions as the bonding pads can be transferred to the first substrate 10, and the remaining piezoelectric components can be used in next time. When the second substrate 40 is peeled off, parts of the second substrate 40 can be selectively peeled off, that is, only the part of the second substrate 40 that is in contact with the piezoelectric components that are bonded onto the first substrate 10 is peeled off. The piezoelectric components that are not bonded onto the first substrate 10 are reserved on the second substrate 40.

In the piezoelectric apparatus manufactured by the manufacturing method provided by the embodiments of the present disclosure, the strip-shaped electrode pins 601 included in the electrode structure 60 of the piezoelectric component may be directly inserted into the corresponding bonding pads in a normal temperature environment or a low temperature environment (such as an environment with a temperature below 170° C.), which not only enables the piezoelectric component and the first substrate 10 to be accurately aligned, but also effectively increases the contact area between the piezoelectric component and the first substrate 10, thereby enhancing the bonding strength between the piezoelectric component and the first substrate 10. Moreover, since the piezoelectric component and the bonding pad on the first substrate 10 achieve an electrical connection with the high Young's modulus and high strength, even after the subsequent high-temperature annealing process, a degree of misalignment between the piezoelectric component and the bonding pad will not be too large, so as to ensure the bonding accuracy of bonding the piezoelectric component onto the first substrate 10.

In addition, in the piezoelectric apparatus manufactured by the manufacturing method provided by the embodiments of the present disclosure, when the piezoelectric component is bonded to the bonding pad of the first substrate 10, the temperature of the piezoelectric component and/or the temperature of the first substrate 10 may be appropriately increased (for example, the temperature may be set close to a melting point temperature of the bonding pad), which facilitates the insertion of the electrode pins 601 included in the electrode structure 60 of the piezoelectric component into the corresponding bonding pads, to form a finite solid solution. Furthermore, because the strip-shaped electrode pins 601 are inserted into the corresponding bonding pads, even if in a high-temperature environment, the thermal expansion coefficients of the piezoelectric component and the first substrate 10 are different, too much misalignment will not be generated between the piezoelectric component and the bonding pad, which can also ensure the bonding accuracy of bonding the piezoelectric component onto the first substrate 10.

In some embodiments, a step of forming the plurality of bonding pads on the first substrate 10 specifically includes: sequentially forming a transition film layer and a conductive film layer that are stacked on the first substrate 10; and patterning the transition film layer and the conductive film layer simultaneously through one patterning process to form a transition pattern 20 and a conductive pattern 30 that are stacked.

Exemplarily, metal nickel (Ni) is used to grow the transition film layer with a thickness of 100 nm on the first substrate 10, and metal tin (Sn) is used to grow the conductive film layer with a thickness of 1000 nm on a side of the transition film layer facing away from the first substrate 10. The transition film layer and the conductive film layer are simultaneously patterned through a single patterning process to form the transition pattern 20 and the conductive pattern 30 that are stacked.

In some embodiments, a step of forming the plurality of piezoelectric components on the second substrate 40 specifically includes:

forming a piezoelectric film on the second substrate 40;
patterning the piezoelectric film to form a plurality of component bodies 50;
forming a metal thin film on a side of the plurality of component bodies 50 facing away from the second substrate 40; and
patterning the metal thin film to form at least one electrode structure 60 on each of the component bodies 50.

Exemplarily, the second substrate 40 is a sapphire substrate, and a piezoelectric film (such as a PZT film) is grown on the sapphire substrate by using the radio-frequency sputtering (RF sputter) technique. Exemplarily, a thickness of the piezoelectric film is between 2 μm and 20 μm, where endpoint values may be inclusive.

After the piezoelectric film is formed, an annealing process is performed on the piezoelectric film in an air environment with a temperature greater than 650° C. for one hour, so as to crystallize the piezoelectric film and better release the stress of the piezoelectric film. Therefore, the ductility and toughness of the piezoelectric film can be improved.

After the annealing process is performed on the piezoelectric film, the piezoelectric film may be patterned to form a plurality of independent component bodies 50. A metal thin film is formed on a side of the plurality of independent component bodies 50 facing away from the second substrate 40. The metal thin film is patterned to form at least one electrode structure 60 on each of the component bodies 50. Each of the at least one electrode structure 60 includes a plurality of strip-shaped electrode pins 601.

In some embodiments, a step of pressing each of the electrode structures 60 of the plurality of piezoelectric components into a corresponding one of the bonding pads specifically includes: heating the bonding pads to a preset temperature; and pressing, in an environment with an inert atmosphere, each of the electrode structures 60 in the plurality of piezoelectric components into a corresponding one of the bonding pads.

In some embodiments, the preset temperature may be set close to a melting point temperature of the bonding pads. For example, the preset temperature is 40% to 99% of the melting point temperature. For another example, the preset temperature is 230° C. When the temperature is close to the melting point, the Young's modulus and elastic modulus of the material Sn of the conductive pattern 30 of the bonding pads both decrease, and under the temperature condition of near the melting point, the electrode structure 60 of the piezoelectric component is more likely to be pressed into the material Sn of the bonding pads, and forms a finite solid solution. In addition, the piezoelectric component is in contact with a large surface area of the bonding pads, which improves the bonding strength.

Exemplarily, the first substrate 10 includes a glass substrate, the first substrate 10 may be heated to 210° C., and the temperature of the piezoelectric component may be set between 25° C. and 100° C.

Exemplarily, the inert atmosphere includes $N_2$, or a mixed gas of $H_2$ and $N_2$, and the first substrate 10 provided with bonding pads and the second substrate 40 provided with the piezoelectric components are both provided in the inert protective atmosphere, the electrode structures 60 in the plurality of piezoelectric components are pressed into the corresponding bonding pads in an environment with a temperature of 230° C. Exemplarily, the pressing process lasts for 10 seconds.

Exemplarily, after the electrode structures 60 in the plurality of piezoelectric components are pressed into the corresponding bonding pads, that is, after the bonding process is completed, the second substrate 40 may be cooled by a cooling device.

When the bonding pad is heated to the preset temperature, the rigidity of the bonding pad decreases, so that the electrode structures 60 in the plurality of piezoelectric components are more easily pressed into the bonding pads, so that the electrode structures 60 and the bonding pads form finite solid solutions.

In some embodiments, the manufacturing method further includes: performing an annealing process on the electrode structures 60 and the bonding pads, after peeling the second substrate 40 from the piezoelectric components.

Specifically, after the second substrate 40 is peeled off from the piezoelectric components, the electrode structures 60 and the bonding pads are subjected to the annealing process at 300° C. in the inert protective atmosphere, so that the finite solid solutions formed by the electrode structures 60 and the bonding pads become solid solutions. Thus, the electrode structures 60 and the bonding pads have the high Young's modulus and high strength after being bonded.

In some embodiments, the manufacturing method further includes: after peeling the second substrate 40 from the piezoelectric components, depositing a metal layer on a side of the piezoelectric components facing away from the bonding pads; and patterning the metal layer to form a signal transmission line connected with the piezoelectric components.

Specifically, after the second substrate 40 is peeled from the piezoelectric components, the metal layer may be deposited on the side of the piezoelectric components away from the bonding pads, and then the metal layer is patterned through a patterning process to form the signal transmission line connected with the piezoelectric components.

Unless otherwise defined, technical terms or scientific terms used in the present disclosure shall have the usual meanings understood by those with ordinary skills in the field to which this disclosure belongs. Similar words such as "first" and "second" used in the present disclosure do not indicate any order, quantity or importance, but are only used to distinguish different components. Similar words such as "include" or "comprise" mean that an element or item appearing before the word covers an element or item listed after the word and their equivalents, but does not exclude other elements or items. Similar words such as "connected", "coupled" or "interconnected" are not limited to physical or mechanical connections, but may include electrical connections, whether direct or indirect. Similar words such as "on", "below", "left" and "right" are only used to indicate a relative position relationship, and when an absolute position of the described object changes, the relative position relationship may also change accordingly.

It is appreciated that when an element such as a layer, film, region, or substrate is referred to as being "on" or "below" another element, the element may be "directly" "on" or "below" the other element, or there may be an intermediate element between the two elements.

In the description of the foregoing embodiments, specific features, structures, materials, or characteristics may be combined in any one or more embodiments or examples in a suitable manner.

The above embodiments are only specific implementations of the present disclosure, but the protection scope of the present disclosure is not limited thereto. Any person skilled in the art can easily think of changes or substitutions within the technical scope disclosed in the present disclosure, which shall fall within the protection scope of the present disclosure. Therefore, the protection scope of the present disclosure should be subject to the protection scope of the appended claims.

What is claimed is:

1. A piezoelectric apparatus, comprising a plurality of piezoelectric components, wherein each of the plurality of the piezoelectric components comprises: a component body and at least one electrode structure arranged on a side of the component body,
    wherein the at least one electrode structure comprises a plurality of electrode pins, and the plurality of electrode pins is arranged at intervals;
    wherein the piezoelectric apparatus further comprises a first substrate, and a plurality of bonding pads arranged on the first substrate, wherein the electrode structures in the plurality of piezoelectric components are correspondingly embedded in the plurality of bonding pads;
    wherein the first substrate is a display panel;
    wherein the display panel is a liquid crystal display panel; the liquid crystal display panel includes an array substrate and a color filter substrate that are arranged oppositely, and a liquid crystal layer arranged between the array substrate and the color filter substrate; and the plurality of bonding pads are formed on a side of the color filter substrate facing away from the liquid crystal layer.

2. The piezoelectric apparatus according to claim 1, wherein each of the bonding pads comprises a transition pattern and a conductive pattern that are stacked, and the transition pattern is located between the conductive pattern and the first substrate,
    wherein in a direction perpendicular to the first substrate, heights of the electrode pins comprised in the electrode structures are smaller than a thickness of the conductive pattern.

3. The piezoelectric apparatus according to claim 2, wherein the transition pattern is made of nickel (Ni), the conductive pattern is made of tin (Sn), and each of the electrode structures of the plurality of piezoelectric components is embedded in the conductive pattern of a corresponding one of the bonding pads.

4. The piezoelectric apparatus according to claim 1, wherein the first substrate comprises a rigid substrate or a flexible substrate.

5. The piezoelectric apparatus according to claim 1, wherein the display panel is an organic light emitting diode display panel; and the piezoelectric apparatus is formed on a cover plate of the organic light emitting diode display panel.

6. The piezoelectric apparatus according to claim 1, wherein the plurality of piezoelectric components form a thin film vibrator on the display panel.

7. The piezoelectric apparatus according to claim 1, wherein the component body comprises a lead zirconate titanate piezoelectric film.

8. The piezoelectric apparatus according to claim 1, wherein a height of each of the plurality of the electrode pins in a direction perpendicular to the component body is greater than 1 μm.

9. The piezoelectric apparatus according to claim 1, wherein the plurality of electrode pins is distributed in an array, an extension direction of each of the electrode pins is perpendicular to the component body, and a minimum value of a width of each of the electrode pins in a first direction is equal to a minimum value of a distance between the electrode pin and an adjacent electrode pin in the first direction, wherein the first direction is perpendicular to the extending direction.

10. The piezoelectric apparatus according to claim 1, wherein the plurality of electrode pins has same dimensions and is arranged at equal intervals, an extending direction of each of the electrode pins is perpendicular to the component body, and a width of each of the electrode pins in a first direction is equal to a distance of any two adjacent ones of the electrode pins in the first direction, wherein the first direction is perpendicular to the extension direction.

11. The piezoelectric apparatus according to claim 1, wherein each of the electrode pins is a cylinder, and a diameter of each of the electrode pins is between 3 μm and 4 μm, where endpoint values are inclusive.

12. The piezoelectric apparatus according to claim 1, wherein each of the electrode pins comprises a first metal pattern and a second metal pattern that are stacked, and the first metal pattern and the second metal pattern are made of different metal materials.

13. The piezoelectric apparatus according to claim 12, wherein the first metal pattern is located between the component body and the second metal pattern, the first metal pattern is made of titanium (Ti), and the second metal pattern is made of gold (Au) or copper (Cu).

14. A method for manufacturing the piezoelectric apparatus according to claim 1, comprising:
  forming the plurality of bonding pads on the first substrate;
  forming the plurality of piezoelectric components on a second substrate;
  pressing each of the electrode structures in the plurality of piezoelectric components into a corresponding one of the bonding pads; and
  peeling the second substrate from the plurality of piezoelectric components.

15. The method according to claim 14, wherein the forming the plurality of bonding pads on the first substrate specifically comprises:
  sequentially forming a transition film layer and a conductive film layer that are stacked on the first substrate; and
  patterning the transition film layer and the conductive film layer simultaneously through one patterning process to form a transition pattern and a conductive pattern that are stacked.

16. The method according to claim 14, wherein the forming the plurality of piezoelectric components on the second substrate specifically comprises:
  forming a piezoelectric film on the second substrate;
  patterning the piezoelectric film to form a plurality of component bodies;
  forming a metal thin film on a side of the plurality of device bodies facing away from the second substrate; and
  patterning the metal thin film to form the at least one electrode structure on each of the component bodies;
  or,
  wherein the pressing each of the electrode structures in the plurality of piezoelectric components into a corresponding one of the bonding pads specifically comprises:
  heating the bonding pads to a preset temperature; and
  pressing, in an environment with an inert atmosphere, each of the electrode structures in the plurality of piezoelectric components into a corresponding one of the bonding pads.

17. The method according to claim 14, further comprising:
  performing an annealing process on the electrode structures and the bonding pads, after peeling the second substrate from the piezoelectric components;
  or,
  after peeling the second substrate from the piezoelectric components, depositing a metal layer on a side of the piezoelectric components facing away from the bonding pads; and
  patterning the metal layer to form a signal transmission line connected with the piezoelectric components.

* * * * *